(12) United States Patent
Yoshida et al.

(10) Patent No.: US 11,041,931 B2
(45) Date of Patent: Jun. 22, 2021

(54) VOLTAGE MEASUREMENT DEVICE WITH SELF-DIAGNOSIS FUNCTION, AND SELF-DIAGNOSIS METHOD OF VOLTAGE MEASUREMENT DEVICE

(71) Applicants: YAZAKI CORPORATION, Tokyo (JP); HONDA MOTOR CO., LTD., Tokyo (JP)

(72) Inventors: Haruhiko Yoshida, Makinohara (JP); Seiichiro Kondo, Wako (JP)

(73) Assignees: YAZAKI CORPORATION, Tokyo (JP); HONDA MOTOR CO., LTD., Tokyo (JP)

( * ) Notice: Subject to any disclaimer, the term of this patent is extended or adjusted under 35 U.S.C. 154(b) by 104 days.

(21) Appl. No.: 16/569,460

(22) Filed: Sep. 12, 2019

(65) Prior Publication Data

US 2020/0096593 A1 Mar. 26, 2020

(30) Foreign Application Priority Data

Sep. 20, 2018 (JP) .............................. JP2018-176337

(51) Int. Cl.
*H02M 3/155* (2006.01)
*G01R 35/00* (2006.01)
*G01R 19/00* (2006.01)

(52) U.S. Cl.
CPC ......... *G01R 35/00* (2013.01); *G01R 19/0084* (2013.01)

(58) Field of Classification Search
CPC ........................... G01R 35/00; G01R 19/0084
See application file for complete search history.

(56) References Cited

U.S. PATENT DOCUMENTS

2020/0292601 A1* 9/2020 Kurachi ............. G01R 27/2605

FOREIGN PATENT DOCUMENTS

JP 5-199742 A 8/1993

* cited by examiner

*Primary Examiner* — Clayton E. LaBalle
*Assistant Examiner* — Michael A Harrison
(74) *Attorney, Agent, or Firm* — Kenealy Vaidya LLP

(57) ABSTRACT

A voltage measurement device includes a voltage measurement circuit part, a voltage generation circuit part, and a control unit. In a voltage measurement mode, a measurement result of the input voltage is detected as an output voltage value based on the output signal of the voltage measurement circuit part. In a self-diagnosis mode, it is determined whether the measured output voltage value when the lower limit voltage is applied by the voltage generation circuit part is within a specific lower limit range (first determination). Further, a specific intermediate range is set based on the output voltage value and a specific upper limit range, and it is determined whether the output voltage value when the intermediate voltage is applied by the voltage generation circuit part is within the specific intermediate range (second determination). Self-diagnosis of the voltage measurement circuit part is performed based on the first and second determinations.

3 Claims, 5 Drawing Sheets

VOLTAGE MEASUREMENT DEVICE WITH SELF-DIAGNOSIS FUNCTION, AND SELF-DIAGNOSIS METHOD OF VOLTAGE MEASUREMENT DEVICE

CROSS-REFERENCE TO RELATED APPLICATIONS

This application is based on and claims priority under 35 USC 119 from Japanese Patent Application No. 2018-176337 filed on Sep. 20, 2018, the contents of which are incorporated herein by reference.

TECHNICAL FIELD

The present disclosure relates to a voltage measurement device with a self-diagnosis function and a self-diagnosis method of the voltage measurement device.

BACKGROUND ART

In related art, there is widely known a voltage measurement device that includes a voltage measurement circuit part that generates an output signal according to a voltage (input voltage) between two input portions, and measures a measurement result of the input voltage as an output voltage value based on the output signal (for example, see Patent Literature 1). This type of voltage measurement device can be mounted on an electric vehicle driven by an electric motor and used to measure the voltage of a battery that supplies power to the electric motor.

CITATION LIST

Patent Literature

Patent Literature 1: JP-A-H05-199742

SUMMARY OF INVENTION

In the voltage measurement device mounted on a vehicle, it is necessary to diagnose whether the voltage measurement circuit part is normal at every predetermined timing in order to ensure the accuracy of the output voltage value. A method of performing this diagnosis includes, for example, actually applying a lower limit voltage of the input voltage range set in advance between the two input portions, determining whether the output voltage value at that time meets a specific lower limit range of the output voltage value that it needs to meet when the input voltage is the lower limit voltage, actually applying an upper limit voltage of the input voltage range between the two input portions, and determining whether the output voltage value at that time meets a specific upper limit range of the output voltage value that it needs to meet when the input voltage is the upper limit voltage.

In order to perform the self-diagnosis with respect to the voltage measurement device itself mounted on the vehicle using the diagnostic method described above, it is necessary to mount the voltage generation circuit part capable of generating the lower limit voltage and the upper limit voltage to the voltage measurement device. However, in such a voltage measurement device with a self-diagnosis function, particularly when the upper limit voltage is very high, it is necessary to use high-voltage components and to secure a relatively long creepage distance in order to achieve electrical insulation. For this reason, there is a problem that it is necessary to increase the size of the voltage generation circuit part so as to withstand high voltage, and as a result, the voltage measurement device as a whole is increased in size.

According to the present disclosure, there is provided a voltage measurement device with a self-diagnosis function capable of suppressing an increase in size of a system as a whole by suppressing an increase in size of a voltage generation circuit part, and a self-diagnosis method of the voltage measurement device.

In order to achieve the above object, a voltage measurement device with a self-diagnosis function and a self-diagnosis method of a voltage measurement device according to the present invention is characterized by the following (1) to (3).

(1) A voltage measurement device with a self-diagnosis function including:

a voltage measurement circuit part that generates an output signal according to an input voltage being a voltage between two input portions;

a voltage generation circuit part capable of generating a voltage in a predetermined range; and a control unit connected to the voltage measurement circuit part and the voltage generation circuit part, wherein the control unit is configured to:

in a voltage measurement mode, detect a measurement result of the input voltage as an output voltage value based on the output signal of the voltage measurement circuit part: and in a self-diagnosis mode, perform, in a first state in which a lower limit voltage of an input voltage range is applied between the two input portions using the voltage generation circuit part, a first determination that determines whether or not the output voltage value detected based on the output signal of the voltage measurement circuit part is within a specific lower limit range that the output voltage value should take when the input voltage is the lower limit voltage, set a specific intermediate range that the output voltage value should take when the input voltage is an intermediate voltage between the lower limit voltage and the upper limit voltage, based on the output voltage value measured in the first state and a specific upper limit range that the output voltage value should take when the input voltage is the upper limit voltage of the input voltage range, perform, in a second state in which the intermediate voltage is applied between the two input portions using the voltage generation circuit part, a second determination that determines whether or not the output voltage value detected based on the output signal of the voltage measurement circuit part is within the set specific intermediate range, and perform self-diagnosis as to whether or not the voltage measurement circuit part is normal based on the results of the first determination and the second determination.

(2) In the voltage measurement device with a self-diagnosis function described in the above (1), the control unit is configured to set the specific intermediate range based on the output voltage value detected in the first state, and an upper limit value and a lower limit value of the specific upper limit range.

(3) A self-diagnosis method of a voltage measurement device having: a voltage measurement circuit part that generates an output signal according to an input voltage that is a voltage between two input portions; and a voltage generation circuit part that generates a voltage within a predetermined range, and detecting a measurement result of the input voltage as an output voltage value based on the output signal of the voltage measurement circuit part, the self-diagnosis method including:

performing, in a first state in which a lower limit voltage of the input voltage range is applied between the two input portions using the voltage generation circuit part, a first determination that determines whether or not the output voltage value measured based on the output signal of the voltage measurement circuit part is within a specific lower limit range that the output voltage value should take when the input voltage is the lower limit voltage:

setting a specific intermediate range that the output voltage value should take when the input voltage is an intermediate voltage between the lower limit voltage and the upper limit voltage, based on the output voltage value measured in the first state and a specific upper limit range that the output voltage value should take when the input voltage is the upper limit voltage of the input voltage range;

performing, in a second state in which the intermediate voltage is applied between the two input portions using the voltage generation circuit part, a second determination that determines whether or not the output voltage value measured based on the output signal of the voltage measurement circuit part is within the set specific intermediate range; and performing self-diagnosis as to whether or not the voltage measurement circuit part is normal based on the results of the first determination and the second determination.

According to the voltage measurement device with a self-diagnosis function having configuration (1) described above, when the lower limit voltage is actually applied as the input voltage (at the time of applying the lower limit voltage), it is determined whether the output voltage value meets a specific lower limit range (first determination), and when an intermediate voltage is actually applied as the input voltage (at the time of applying the intermediate voltage), it is determined whether the output voltage value meets a specific intermediate range (second determination), and based on the results of the first determination and the second determination, self-diagnosis is performed as to whether the voltage measurement circuit part is normal.

In this example, the specific intermediate range is set based on the actual output voltage value at the time of applying the lower limit voltage, and the specific upper limit range. By doing this, it is determined whether the output voltage value at the time of applying the intermediate voltage meets the specific intermediate range, thereby accurately determining whether the output voltage value at the time of applying the upper limit voltage as the input voltage at the time of actually applying the upper limit voltage meets the specific upper limit range (this will be described in detail below).

As described above, by actually applying the lower limit voltage and the intermediate voltage lower than the upper limit voltage as the input voltages, it is determined whether the output voltage value at the time applying the lower limit voltage meets the specific lower limit range and whether the output voltage value at the time applying the upper limit voltage meets the specific upper limit range, thereby performing self-diagnosis as to whether the voltage measurement circuit part is normal.

Therefore, it is possible to miniaturize the voltage generation circuit part as much as there is a decrease in the maximum value of the voltage value required to be generated at the voltage generation circuit part from the upper limit voltage to the intermediate voltage. As a result, even in the case where the upper limit voltage is very high, the increase in size of the voltage generation circuit part may be suppressed, and the increase in size of the voltage measurement device as a whole may be suppressed.

According to the voltage measurement device with a self-diagnosis function having configuration (2) described above, it is possible to accurately set the specific intermediate range so as to be able to accurately determine whether the output voltage value at the time of applying the upper limit voltage meets the specific upper limit range by way of determining whether the output voltage value at the time of applying the intermediate voltage meets the specific intermediate range (this will be described below).

The self-diagnosis method of the voltage measurement device having configuration (3) described above includes determining whether the output voltage value at the time of applying the lower limit voltage meets the specific lower limit range (first determination), determining whether the output voltage value at the time of applying the intermediate voltage meets the specific intermediate range (second determination), and based on the results of the first determination and the second determination, performing self-diagnosis as to whether the voltage measurement circuit part is normal.

In this example, the specific intermediate range is set based on the actual output voltage value at the time of applying the lower limit voltage, and the specific upper limit range. By doing this, it is determined whether the output voltage value at the time of applying the intermediate voltage meets the specific intermediate range, thereby accurately determining whether the output voltage value at the time of applying the upper limit voltage meets the specific upper limit range (this will be described in detail below).

As described above, by actually applying the lower limit voltage and the intermediate voltage lower than the upper limit voltage as the input voltages, it is determined whether the output voltage value at the time applying the lower limit voltage meets the specific lower limit range and whether the output voltage value at the time applying the upper limit voltage meets the specific upper limit range, and self-diagnosis is thereby performed as to whether the voltage measurement circuit part is normal.

Therefore, it is possible to miniaturize the voltage generation circuit part as much as there is a decrease in the maximum value of the voltage value required to be generated at the voltage generation circuit part from the upper limit voltage to the intermediate voltage. As a result, even in the case where the upper limit voltage is high, the increase in the size of the voltage generation circuit part may be suppressed, and the increase in size of the voltage measurement device as a whole may be suppressed.

According to the present disclosure, it is possible to provide a voltage measurement device with a self-diagnosis function capable of suppressing an increase in size of a system as a whole by suppressing an increase in size of a voltage generation circuit part, and a self-diagnosis method of the voltage measurement device.

The present disclosure has been briefly described above. Furthermore, the details of the present disclosure will be further clarified by reading the modes for carrying out the disclosure (hereinafter referred to as "embodiments") described below with reference to the attached drawings.

DESCRIPTION OF EMBODIMENTS

<Embodiment>

Hereinafter, a voltage measurement device 1 with a self-diagnosis function and a self-diagnosis method of the voltage measurement device 1 according to an exemplary embodiment of the present disclosure will be described with reference to the drawings.

Figure 1:
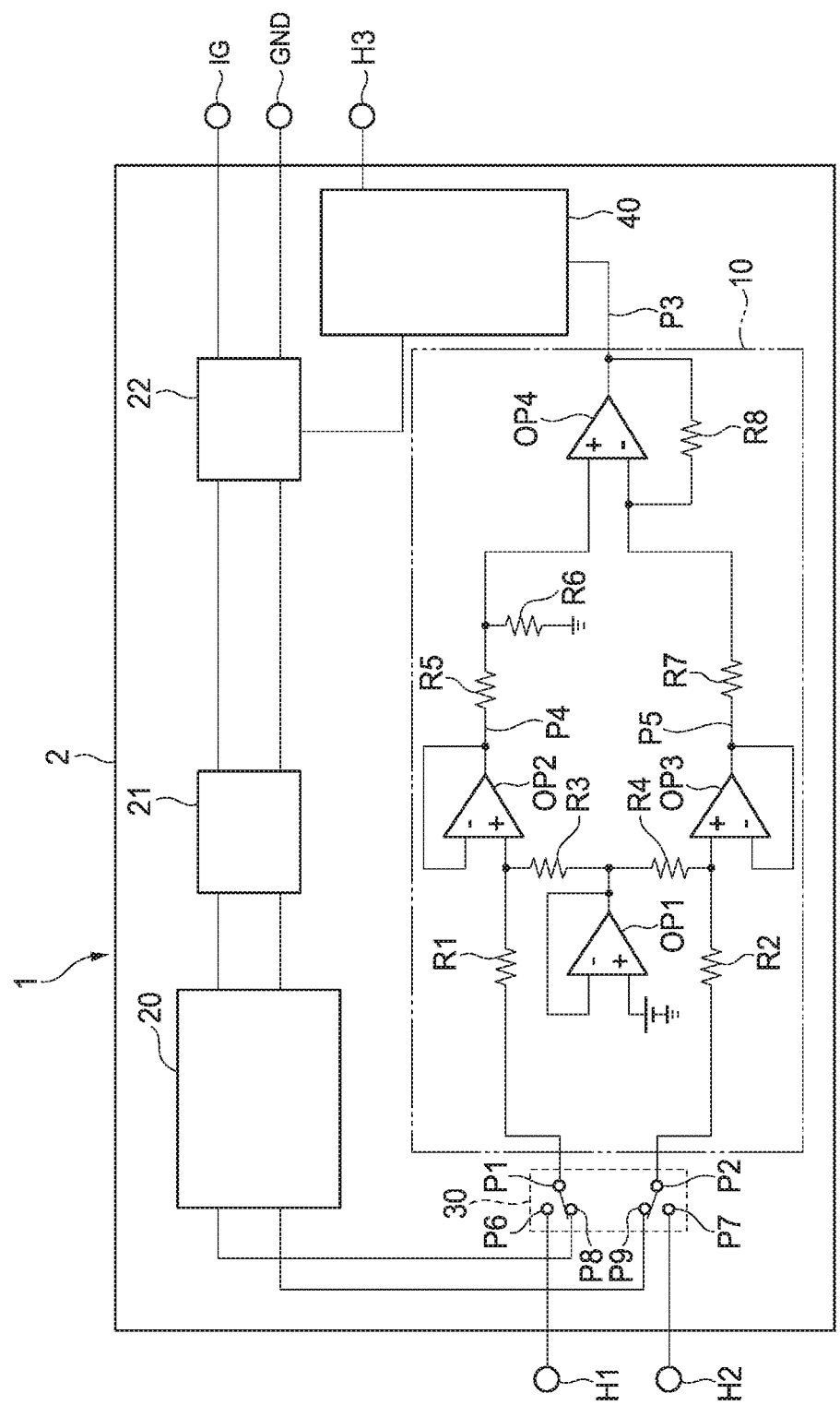
FIG. 1 is a circuit diagram showing a voltage measurement device with a self-diagnosis function according to an embodiment of the present invention.

As shown in FIG. 1, the voltage measurement device 1 includes an electric circuit or the like disposed on one substrate 2. The voltage measurement device 1 is typically mounted on an electric vehicle driven by an electric motor and used to measure the voltage of a battery that supplies power to the electric motor.

As shown in FIG. 1, the voltage measurement device 1 includes a voltage measurement circuit part 10, a voltage generation circuit part 20, a switch circuit part 30, and a control unit 40.

The voltage measurement circuit part 10 is a known electric circuit that generates, at an output portion P3, an output signal corresponding to a voltage (potential difference) (hereinafter referred to as "input voltage") between two input portions P1 and P2. The voltage measurement circuit part 10 includes resistors R1 to R8 and operational amplifiers OP1 to OP4. Drive voltages of the operational amplifiers OP1 to OP4 are supplied from a power supply circuit 22 described below.

The resistors R1 to R4 are mainly provided to make the voltage (potential difference) between the intermediate portions P4 and P5 to a value resulting from reducing the input voltage (voltage between the input portions P1 and P2) by a predetermined reduction rate. The operational amplifiers OP to OP3 are mainly provided to stabilize the voltage between the intermediate portions P4 and P5.

The resistors R5 to R8 and the operational amplifier OP4 form a so-called differential amplifier circuit. That is, the voltage between the intermediate portions P4 and P5 is increased or decreased at a predetermined increase and decrease rate and output to the output portion P3. As described above, in the voltage measurement circuit part 10, an output signal corresponding to the input voltage (voltage between the input portions P1 and P2) is generated at the output portion P3.

The voltage generation circuit part 20 is configured of a known electric circuit, and is configured to step up and down a constant voltage generated by the insulation power supply 21 within a predetermined range and output a result as a voltage (potential difference) between two contact portions P8 and P9 described below. Here, the description of the detailed circuit configuration of the voltage generation circuit part 20 will be omitted. The drive voltage of the voltage generation circuit part 20 is supplied from a power supply circuit 22 described below.

The switch circuit part 30 serves to switch the electric circuit between a voltage measurement mode and a self-diagnosis mode. Details of the voltage measurement mode and the self-diagnosis mode will be described below. The switch circuit part 30 operates to connect the input portions P1 and P2 to the contact portions P6 and P7 respectively connected to external input terminals H1 and H2 in the voltage measurement mode, and connect the input portions P1 and P2 to the contact parts P8 and P9 connected to the output side of the voltage generation circuit part 20 in the self-diagnosis mode. The drive voltage of the switch circuit part 30 is supplied from the power supply circuit 22 described below.

The control unit 40 is configured of a microcomputer and controls the voltage generation circuit part 20 and the switch circuit part 30. The drive voltage of the control unit 40 is supplied from the power supply circuit 22 connected to an ignition IG of the vehicle and the ground GND of the vehicle.

Specifically, the control unit 40 controls the voltage generation circuit part 20 so that the output voltage of the voltage generation circuit part 20 may be arbitrarily adjusted within a predetermined range. The control unit 40 is configured to select one of the voltage measurement mode and the self-diagnosis mode based on an external input signal and the like, control the switch circuit part 30, and realize an electric circuit corresponding to the selected mode.

The control unit 40 is configured to receive the output signal of the output portion P3 of the voltage measurement circuit part 10, measure an output voltage value with a measurement result of the input voltage (the voltage between the input portions P1 and P2), and output the measured result to an external electrical device, a memory, and the like through the external output terminal H3. The configuration of the voltage measurement device 1 has been described above. Next, the voltage measurement mode and the self-diagnosis mode will be described in order.

<Voltage Measurement Mode>

The voltage measurement mode is a mode in which the voltage (the voltage between the external input terminals H1 and H2) of the voltage measurement target (for example, a battery of a vehicle) connected to the external input terminals H1 and H2 is measured. As described above, in the voltage measurement mode, the switch circuit part 30 operates to connect the input portions P1 and P2 of the voltage measurement circuit part 10 to the external input terminals H1 and H2, respectively, according to the instruction from the control unit 40. As a result, the voltage between the external input terminals H1 and H2 is input to the voltage measurement circuit part 10 as an input voltage (the voltage between the input portions P1 and P2).

As described above, the voltage measurement circuit part 10 generates an output signal corresponding to the input voltage at the output portion P3. The control unit 40 receives the output signal of the output portion P3, measures an output voltage value with a measurement result of the input voltage (the voltage between the external input terminals H1 and H2), and output the measured result to the external electrical device, a memory, and the like through the external output terminal H3.

<Self-Diagnosis Mode>

The self-diagnosis mode is a mode in which the control unit 40 itself diagnoses whether the voltage measurement circuit part 10 is normal in order to ensure the accuracy of the output voltage value. The self-diagnosis mode is selected each time a predetermined time elapses, or whenever the ignition IG changes from off to on, for example.

As described above, in the self-diagnosis mode, the switch circuit part 30 operates to connect the input portions P1 and P2 of the voltage measurement circuit part 10 to the output side of the voltage generation circuit part 20 according to the instruction from the control unit 40. As a result, the output voltage of the voltage generation circuit part 20 is applied to the voltage measurement circuit part 10 as an input voltage (the voltage between the input portions P1 and P2).

The method of performing self-diagnosis as to whether the voltage generation circuit part 20 is normal includes actually applying a lower limit voltage V1 of an input voltage range set in advance between the input portions P1 and P2 using the voltage generation circuit part 20, determining whether an output voltage value at that time meets a specific lower limit range S1 (see FIG. 2) of the output voltage value that it needs to meet when the input voltage is the lower limit voltage V1, actually applying an upper limit voltage V2 of the input voltage range between the input portions P1 and P2 using the voltage generation circuit part 20, and determining whether an output voltage value at that time meets a specific upper limit range S2 (see FIG. 2) of the output voltage value that it needs to meet when the input voltage is the upper limit voltage.

However, when this method is adopted, the maximum value of the voltage value that the voltage generation circuit part 20 needs to generate is the upper limit voltage V2, and accordingly, when the upper limit voltage V2 is very high, the voltage generation circuit part 20 needs to be increased in size so as to withstand high voltage. As a result, there is a problem that the size of the voltage measurement device 1 as a whole is increased.

In order to cope with this problem, the control unit 40 executes self-diagnosis as to whether the voltage generation circuit part 20 is normal by the method described below. The control unit 40 stores in advance a lower limit voltage V1, an upper limit voltage V2, a specific lower limit range S1, a specific upper limit range S2, and an intermediate voltage V3 described below in a memory or the like included therein.

Figure 2:
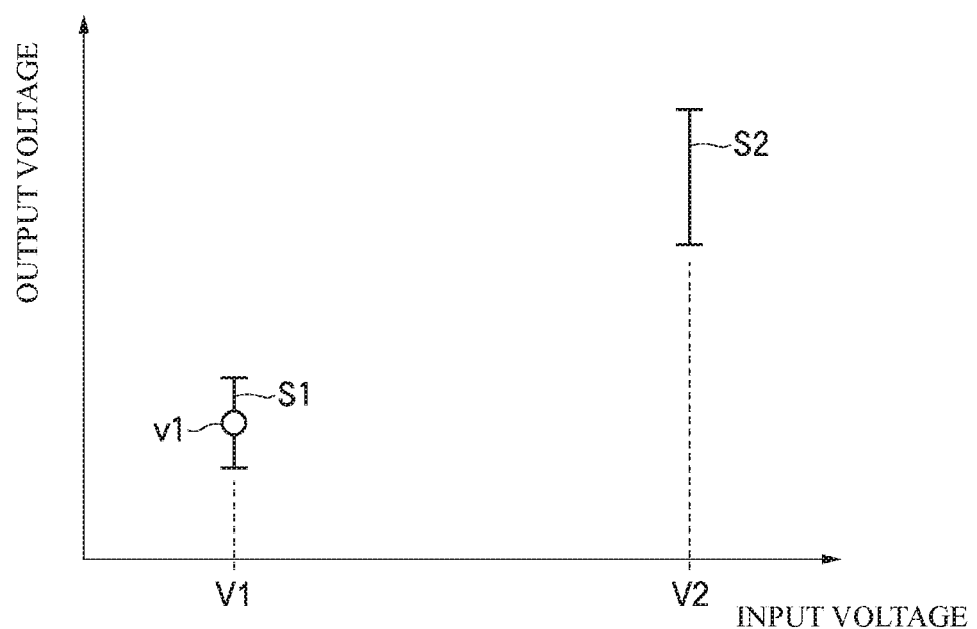
FIG. 2 is a first diagram for explaining a self-diagnosis method of the voltage measurement circuit part.

First, the control unit 40 controls the voltage generation circuit part 20 so that the output voltage of the voltage generation circuit part 20 is the lower limit voltage V1. As a result, the input voltage (the voltage between the input portions P1 and P2) of the voltage measurement circuit part 10 is maintained at the lower limit voltage V1 (at the time of applying the lower limit voltage). As shown in FIG. 2, in this state, the control unit 40 measures the output voltage value based on the output signal of the voltage measurement circuit part 10, and determines whether the measured output voltage value v1 meets the specific lower limit range S1 (first determination).

In the first determination, when it is determined that the output voltage value v1 does not meet the specific lower limit range S1, the control unit 40 immediately ends the self-diagnosis and outputs the diagnosis result indicating that the voltage measurement circuit part 10 is abnormal, to external electric equipment, a memory, and the like through the external output terminal H3.

Figure 3:
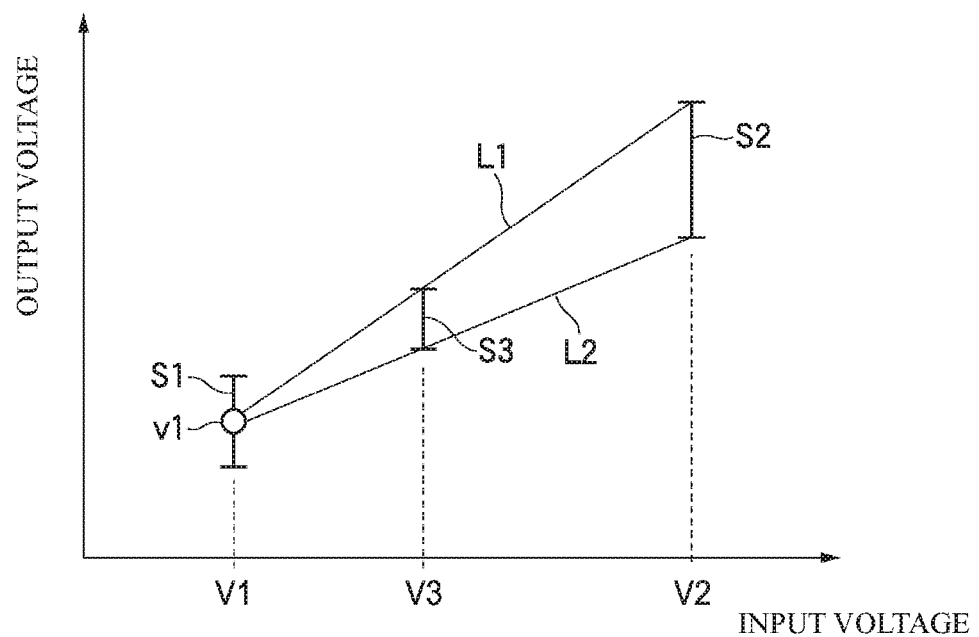
FIG. 3 is a second diagram for explaining the self-diagnosis method of the voltage measurement circuit part.

On the other hand, in the first determination, when it is determined that the output voltage value v1 meets the specific lower limit range S1, the control unit 40 sets a specific intermediate range S3 that the output voltage value needs to meet when the input voltage is the intermediate voltage V3 between the lower limit voltage V1 and the upper limit voltage V2, based on the output voltage value v1 and the specific upper limit range S2 as shown in FIG. 3.

In the example shown in FIG. 3, under the process of the output voltage value transitioning linearly (linear functionally) with respect to the input voltage, the upper limit value of the specific intermediate range S3 is set based on a line segment L1 connecting the output voltage value v1 and the upper limit value of the specific upper limit range S2 and the intermediate voltage V3, and the lower limit value of the specific intermediate range S3 is set based on a line segment L2 connecting the output voltage value v1 and the lower limit value of the specific upper limit range S2 and the intermediate voltage V3. As a result, the specific intermediate range S3 is set.

Figure 4:
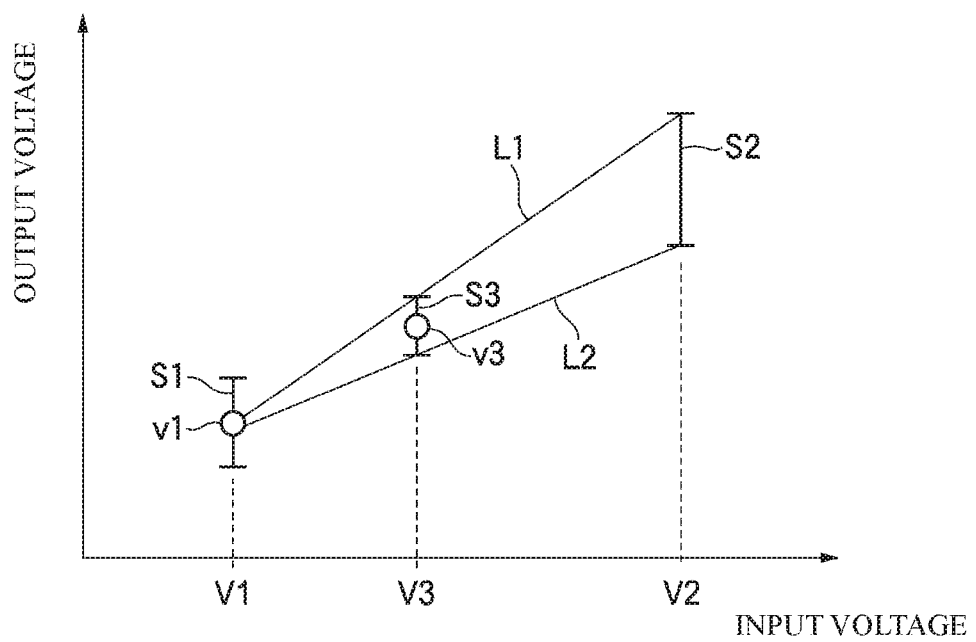
FIG. 4 is a third diagram for explaining the self-diagnosis method of the voltage measurement circuit part.

Next, the control unit 40 controls the voltage generation circuit part 20 so that the output voltage of the voltage generation circuit part 20 is the intermediate voltage V3 (instead of the upper limit voltage V2). As a result, the input voltage (the voltage between the input portions P1 and P2) of the voltage measurement circuit part 10 is maintained at the intermediate voltage V3 (at the time of applying the intermediate voltage). As shown in FIG. 4, in this state, the control unit 40 measures the output voltage value based on the output signal of the voltage measurement circuit part 10, and determines where or not the measured output voltage value v3 meets the specific intermediate range S3 (second determination).

Here, as apparent from FIG. 4, under the process of the output voltage value transitioning linearly with respect to the input voltage, when the output voltage value at the time of applying the intermediate voltage meets the specific intermediate range S3, it means that the output voltage value in the state where the input voltage (voltage between input portions P1 and P2) of the voltage measurement circuit part 10 is maintained at the upper limit voltage V2 (at the time of applying the upper limit voltage) meets the specific upper limit range S2, and when the output voltage value at the time of applying the intermediate voltage does not meet the specific intermediate range S3, it means that the output voltage value at the time of applying the upper limit voltage is not in the specific upper limit range S2. That is, it may be accurately determined whether the output voltage value at the time of applying the upper limit voltage meets the specific upper limit range S2, by determining whether the output voltage value at the time of applying the intermediate voltage meets the specific intermediate range S3.

Therefore, in the second determination, it is substantially determined whether the output voltage value at the time of applying the upper limit voltage meets the specific upper limit range S2, by determining whether the output voltage value v3 meets the specific intermediate range S3.

In this second determination, when it is determined that the output voltage value v3 does not meet the specific intermediate range S3 (that is, when it is determined that the output voltage value at the time of applying the upper limit voltage does not meet the specific upper limit range S2), the control unit 40 outputs the diagnosis result indicating that the voltage measurement circuit part 10 is abnormal, to external electrical equipment, a memory; and the like through the external output terminal H3.

On the other hand, in the second determination, when it is determined that the output voltage value v3 meets the specific intermediate range S3 (that is, when it is determined that the output voltage value at the time of applying the upper limit voltage is in the specific upper limit range S2), it means that it is determined that, in the first determination, the output voltage value v1 at the time of applying the lower limit voltage meets the specific lower limit range S1, and that, in the second determination, the output voltage value at the time of applying the upper limit voltage meets the specific upper limit range S2. In this case, the control unit 40 outputs the diagnosis result indicating that the voltage measurement circuit part 10 is normal, to the external electrical equipment, memory, and the like through the external output terminal H3.

As described above, by actually applying the lower limit voltage V1 and the intermediate voltage V3 lower than the upper limit voltage as the input voltages, it is determined whether the output voltage value v1 at the time applying the lower limit voltage meets the specific lower limit range S and whether the output voltage value at the time applying the upper limit voltage meets the specific upper limit range S2, and self-diagnosis is thereby performed as to whether the voltage measurement circuit part 10 is normal.

As described above, according to the voltage measurement device 1 with a self-diagnosis function and the self-diagnosis method of the voltage measurement device 1 according to the exemplary embodiment of the present disclosure, by actually applying the lower limit voltage V1 and the intermediate voltage V3 lower than the upper limit voltage V2 as the input voltages (voltages between input portions P1 and P2) of the voltage measurement circuit part 10, it is determined whether the output voltage value v1 at the time applying the lower limit voltage meets the specific lower limit range S1 and whether the output voltage value at the time applying the upper limit voltage meets the specific upper limit range S2, and self-diagnosis is thereby performed as to whether the voltage measurement circuit part 10 is normal.

Accordingly, it is possible to miniaturize the voltage generation circuit part 20 as much as there is a decrease in the maximum value of the voltage value required to be generated at the voltage generation circuit part 20 from the upper limit voltage V2 to the intermediate voltage V3. As a result, even in the case where the upper limit voltage V2 is very high, the increase in size of the voltage generation circuit part 20 may be suppressed, and the increase in size of the voltage measurement device 1 as a whole may be suppressed.

In addition, regarding the intermediate voltage V3 (which is greater than the lower limit voltage V1 and smaller than the upper limit voltage V2), since the intermediate voltage V3 has a smaller value, the maximum value of the voltage value required to be generated at the voltage generation circuit part 20 is smaller, and the voltage generation circuit part 20 may be further miniaturized, but the determination accuracy of the "determination of whether the output voltage value at the time of applying the upper limit voltage meets the specific upper limit range S2" performed based on the determination result of whether the output voltage value v3 at the time of applying the intermediate voltage meets the specific intermediate range S3 may be further lowered. Therefore, it is preferable that the intermediate voltage V3 be determined by comparing the required degree of miniaturization of the voltage generation circuit part 20 and the required accuracy of self-diagnosis on whether the voltage measurement circuit part 10 is normal.

<Other Embodiments>

The present invention is not limited to the embodiment described above, and various modifications may be adopted within the scope of the present disclosure. For example, the present disclosure is not limited to the embodiment described above, but may be appropriately modified, improved, and the like. In addition, materials, shapes, dimensions, numbers, positions, and the like of the constituent elements in the embodiment described above are arbitrary as far as the present invention may be achieved, and are not limited.

In the embodiment described above, under the process of the output voltage value transitioning linearly with respect to the input voltage, the specific intermediate range S3 is set based on the output voltage value v1 and the "upper limit value" and the "lower limit value" in the specific upper limit range S2 (see FIG. 3). On the other hand, under the process of the output voltage value transitioning linearly with respect to the input voltage, the specific intermediate range S3 may be set based on the output voltage value v1 and the "value based on the upper limit value" and the "value based on the lower limit value" in the specific upper limit range S2. The "value based on the upper limit value" may be a value slightly smaller than the upper limit value, for example, and the "value based on the lower limit value" may be a value slightly larger than the lower limit value, for example.

Figure 5:
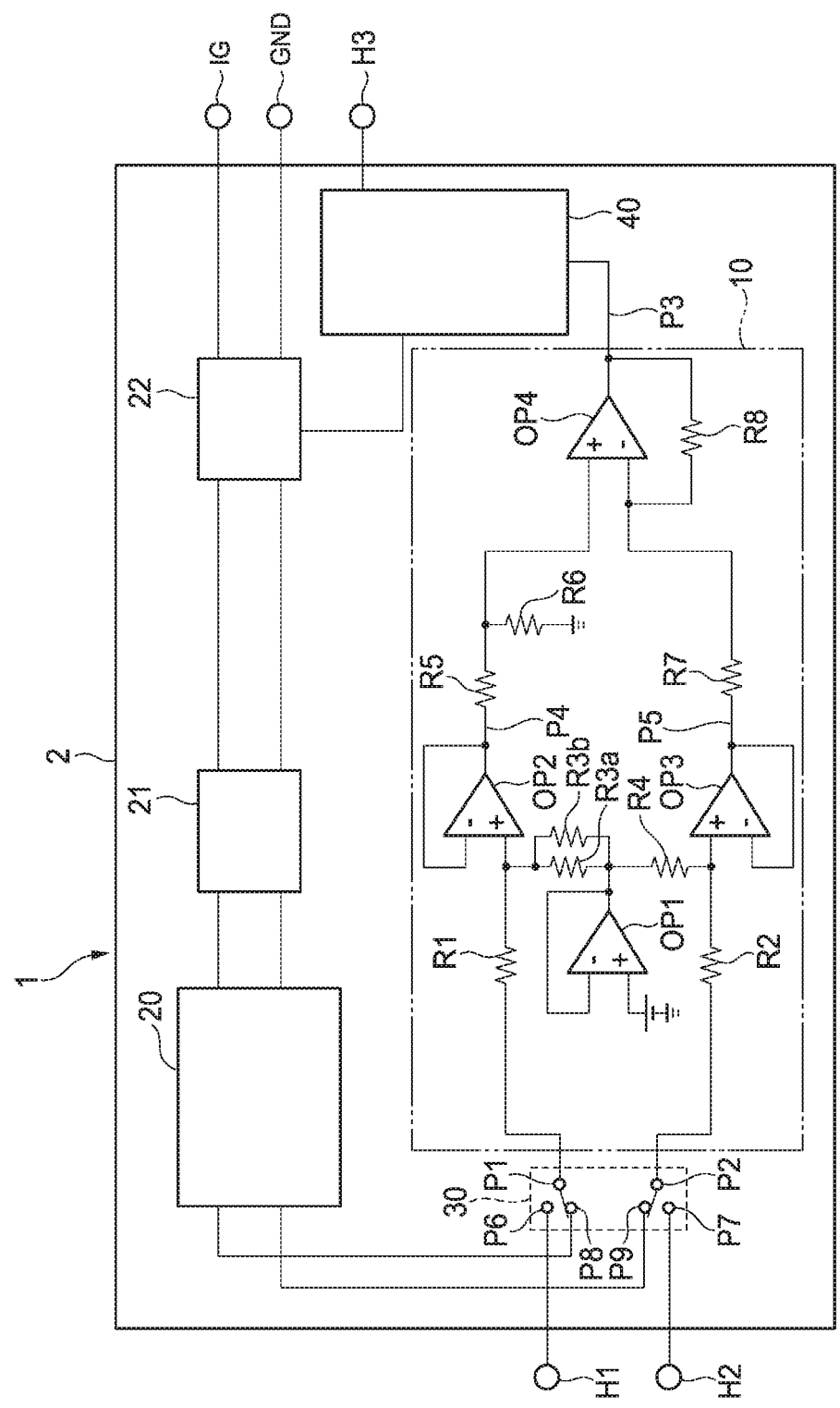
FIG. 5 is a circuit diagram of a voltage measurement device with a self-diagnosis function according to a modification of the exemplary embodiment.

Furthermore, in the above embodiment (see FIG. 1), in the voltage measurement circuit part 10, when the resistor R3 is disconnected, the high voltage of the external input terminal H1 (input portion P1) is input to the operational amplifier OP2 as it is, that is, without it being reduced, and so the operational amplifier OP2 may be excessively loaded. On the other hand, in the example shown in FIG. 5, two resistors R3a and R3b are connected in parallel instead of one resistor R3. As a result, even when one of the two resistors R3a and R3b is disconnected, the other may operate normally, so that the high voltage of the external input terminal H1 (input portion P1) is reduced before input to the operational amplifier OP2. As a result, the degree of burden on the operational amplifier OP2 is reduced.

Here, the features of the embodiment of the voltage measurement device 1 with a self-diagnosis function, and the self-diagnosis method of the voltage measurement device 1 according to the present disclosure described above will be briefly summarized and listed in [1] to [3] as follows.

[1]

A voltage measurement device (1) with a self-diagnosis function, including:

a voltage measurement circuit part (10) that generates an output signal according to an input voltage that is a voltage between two input portions (P1, P2), a voltage generation circuit part (20) capable of generating a voltage in a predetermined range, and a control unit (40) connected to the voltage measurement circuit part (10) and the voltage generation circuit part (20), in which the control unit (40) is configured to:

in a voltage measurement mode, detect a measurement result of the input voltage as an output voltage value based on the output signal of the voltage measurement circuit part (10), and in self-diagnosis mode, perform, in a first state in which a lower limit voltage (V1) of the input voltage range is applied between the two input portions (P1, P2) using the voltage generation circuit part (20), a first determination of determining whether an output voltage value (v1) measured based on the output signal of the voltage measurement circuit part (10) meets a specific lower limit range (S1) that the output voltage value needs to meet when the input voltage is the lower limit voltage (V1), set a specific intermediate range (S3) that the output voltage value needs to meet when the input voltage is an intermediate voltage (V3) between the lower limit voltage (V1) and the upper limit voltage (V2), based on the output voltage value (v1) measured in the first state, and the specific upper limit range (S2) that the output voltage value needs to meet when the input voltage is an upper limit voltage (V2) of the input voltage range, perform, in a second state in which the intermediate voltage (V3) is applied between the two input portions (P1, P2) using the voltage generation circuit part (20), a second determination of determining whether the output voltage value (v3) measured based on the output signal of the voltage measurement circuit part (10) meets the set specific intermediate range (S3), and perform self-diagnosis as to whether the voltage measurement circuit part (10) is normal based on the results of the first determination and the second determination.

[2]

In the voltage measurement device (1) with a self-diagnosis function described in [1], the control unit (40) is configured to set the specific intermediate range (S3) based on the output voltage value measured in the first state, and the upper limit value and the lower limit value of the specific upper limit range (S2).

[3]

A self-diagnosis method of a voltage measurement device (1) including: a voltage measurement circuit part (10) that generates an output signal according to an input voltage that is a voltage between two input portions (P1, P2); and a voltage generation circuit part (20) that may generate a voltage within a predetermined range, and measuring an output voltage value with a measurement result of the input voltage based on the output signal of the voltage measurement circuit part (10), the self-diagnosis method including:

performing, in a first state in which a lower limit voltage (V1) of an input voltage range is applied between the two input portions (P1, P2) using the voltage generation circuit part (20), a first determination of determining whether an output voltage value (v1) measured based on the output signal of the voltage measurement circuit part (10) meets a specific lower limit range (S1) that the output voltage value needs to meet when the input voltage is the lower limit voltage (V1);

setting a specific intermediate range (S3) that the output voltage value needs to meet when the input voltage is an intermediate voltage (V3) between the lower limit voltage (V1) and the upper limit voltage (V2), based on the output voltage value v1 measured in the first state, and the specific upper limit range (S2) that the output voltage value needs to meet when the input voltage is the upper limit voltage (V2) of the input voltage range;

performing, in a second state in which the intermediate voltage (V3) is applied between the two input portions (P1, P2) using the voltage generation circuit part (20), a second determination of determining whether the output voltage value (v3) measured based on the output signal of the voltage measurement circuit part (10) meets the set specific intermediate range (S3); and performing self-diagnosis as to whether the voltage measurement circuit part (10) is normal based on the results of the first determination and the second determination.

What is claimed is:

1. A voltage measurement device with a self-diagnosis function comprising:
   a voltage measurement circuit part that generates an output signal according to an input voltage being a voltage between two input portions;
   a voltage generation circuit part capable of generating a voltage in a predetermined range; and
   a control unit connected to the voltage measurement circuit part and the voltage generation circuit part,
   wherein the control unit is configured to:
   in a voltage measurement mode,
   detect a measurement result of the input voltage as an output voltage value based on the output signal of the voltage measurement circuit part; and
   in a self-diagnosis mode,
   perform, in a first state in which a lower limit voltage of an input voltage range is applied between the two input portions using the voltage generation circuit part, a first determination that determines whether or not the output voltage value detected based on the output signal of the voltage measurement circuit part is within a specific lower limit range that the output voltage value should take when the input voltage is the lower limit voltage,
   set a specific intermediate range that the output voltage value should take when the input voltage is an intermediate voltage between the lower limit voltage and the upper limit voltage, based on the output voltage value measured in the first state and a specific upper limit range that the output voltage value should take when the input voltage is the upper limit voltage of the input voltage range,
   perform, in a second state in which the intermediate voltage is applied between the two input portions using the voltage generation circuit part, a second determination that determines whether or not the output voltage value detected based on the output signal of the voltage measurement circuit part is within the set specific intermediate range, and
   determine that the voltage measurement circuit part is normal when the output voltage value of the first state is within the specific lower limit range and the output voltage value of the second state is within the specific intermediate range.

2. The voltage measurement device with a self-diagnosis function according to claim 1, wherein
   the control unit is configured to set the specific intermediate range based on the output voltage value detected in the first state, and an upper limit value and a lower limit value of the specific upper limit range.

3. A self-diagnosis method of a voltage measurement device including: a voltage measurement circuit part that generates an output signal according to an input voltage that is a voltage between two input portions; and a voltage generation circuit part that generates a voltage within a predetermined range, and detecting a measurement result of the input voltage as an output voltage value based on the output signal of the voltage measurement circuit part, the self-diagnosis method comprising:
   performing, in a first state in which a lower limit voltage of the input voltage range is applied between the two input portions using the voltage generation circuit part, a first determination that determines whether or not the output voltage value measured based on the output signal of the voltage measurement circuit part is within a specific lower limit range that the output voltage value should take when the input voltage is the lower limit voltage;
   setting a specific intermediate range that the output voltage value should take when the input voltage is an intermediate voltage between the lower limit voltage and the upper limit voltage, based on the output voltage value measured in the first state and a specific upper limit range that the output voltage value should take when the input voltage is the upper limit voltage of the input voltage range;
   performing, in a second state in which the intermediate voltage is applied between the two input portions using the voltage generation circuit part, a second determination that determines whether or not the output voltage value measured based on the output signal of the voltage measurement circuit part is within the set specific intermediate range; and determining that the voltage measurement circuit part is normal when the output voltage value of the first state is within the specific lower limit range and the output voltage value of the second state is within the specific intermediate range.

\* \* \* \* \*